(12) United States Patent
Noguchi

(10) Patent No.: US 7,009,295 B2
(45) Date of Patent: Mar. 7, 2006

(54) SEMICONDUCTOR DEVICE

(75) Inventor: Takashi Noguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/722,520

(22) Filed: Nov. 28, 2003

(65) Prior Publication Data
US 2004/0104478 A1   Jun. 3, 2004

(30) Foreign Application Priority Data
Nov. 28, 2002   (JP) ............................. 2002/345641

(51) Int. Cl.
*H01L 23/48* (2006.01)

(52) U.S. Cl. .................. 257/738; 257/81; 257/433; 257/704; 257/713; 257/730; 257/737; 257/749

(58) Field of Classification Search ................ 257/81, 257/82, 225, 433, 434, 680, 681, 660, 626, 257/643, 629–652, 759, 792, 737, 738, 730, 257/704, 713, 749
See application file for complete search history.

(56) References Cited

U.S. PATENT DOCUMENTS

| | | | |
|---|---|---|---|
| 4,894,707 A | | 1/1990 | Yamawaki et al. |
| 5,436,492 A | * | 7/1995 | Yamanaka ................... 257/433 |
| 5,529,959 A | * | 6/1996 | Yamanaka ................... 438/64 |
| 6,105,245 A | * | 8/2000 | Furukawa .................... 29/843 |
| 6,566,239 B1 | * | 5/2003 | Makino et al. ............. 438/612 |
| 6,670,221 B1 | * | 12/2003 | Sakoda et al. ............. 438/112 |
| 2003/0103686 A1 | * | 6/2003 | Ogura ......................... 382/321 |
| 2003/0156743 A1 | * | 8/2003 | Okada et al. ............... 382/124 |
| 2004/0056340 A1 | | 3/2004 | Jobetto |

FOREIGN PATENT DOCUMENTS

| | | |
|---|---|---|
| JP | 63-21870 | 1/1988 |
| JP | 63-197361 | 8/1988 |
| JP | 7-297324 | 11/1995 |
| JP | 8-65579 | 3/1996 |
| JP | 08-065579 | * 3/1996 |
| JP | 10-242442 | * 9/1998 |
| JP | 2001-308349 | 11/2001 |
| JP | 2002-94035 | 3/2002 |
| JP | 2004-111792 | 4/2004 |

* cited by examiner

*Primary Examiner*—Andy Huynh
(74) *Attorney, Agent, or Firm*—Wenderoth, Lind & Ponack, L.L.P.

(57) ABSTRACT

A semiconductor device includes a semiconductor chip having a main surface provided with an integrated circuit including a photoelectric converter and a first wiring for electrically connecting the integrated circuit of the semiconductor chip to respective external terminals. The semiconductor device also includes a sealing resin for sealing the main surface of the semiconductor chip and the first wiring, formed so as to have an opening over the surface of the integrated circuit and a light-transmitting cap for covering the opening of the sealing resin.

13 Claims, 11 Drawing Sheets

SEMICONDUCTOR DEVICE

FIELD OF THE INVENTION

The present invention relates to a semiconductor device containing a photoreception region comprising a photoelectric converter (for example, a solid state image sensor such as a CCD (charge-coupled device), CMOS (Complementary Metal-Oxide-Semiconductor) sensor, photodetector, etc.) in its integrated circuit.

This application is a counterpart of Japanese patent application Serial Number 345641/2002, filed Nov. 28, 2002, the subject matter of which is incorporate herein by reference.

BACKGROUND OF THE INVENTION

As conventional forms of packaging for a semiconductor device containing a photoelectric converter (for example, a solid state image sensor, photodetector, etc.) in an integrated circuit, there are such packages as the so-called plastic package, and ceramic package. There is, for example, a package shown in FIG. 13 (refer to JP-A-2002-94035). This form of package has a case 70 made of plastics or ceramic, and external leads 72 protruding from within the case 70 and extended on the exterior thereof. A single piece semiconductor chip 74 is housed inside the case 70, and a bonding wire 78 interconnects respective electrode pads 76 on top of the semiconductor chip 74 and respective internal ends of the external leads 72, disposed inside the case 70. A photoelectric converter (not shown) is formed in a photoreception region (integrated circuit) of the semiconductor chip 74, and a transparent cap 80 allowing light rays to pass therethrough is provided in a part of the case 70, positioned above the photoreception region.

With the package of such a configuration as described above, however, since the external leads 72 are protruded from the outer wall of the case 70, a proportion of an extruded portion to the package in whole becomes large. This renders it difficult to use the package described above in a device wherein a multitude of components need to be mounted in a small space, such as a mobile phone, handy camera, and so forth.

Due to recent trends toward such miniaturization of electronic equipment as described above, there has since been proposed a package called CSP (Chip Size Package) substantially identical in size to a semiconductor chip in order to enable high density mounting of semiconductor devices to be implemented when mounting the semiconductor devices. However, there exists a problem in that the package proposed cannot be put to use as it is because in the case of a semiconductor device having a photoreception region, there is a need for depositing an insulator layer, a redistribution wiring layer, and so forth, on top of the photoreception region.

With an object of overcoming such a problem, there has since been proposed, for example, a semiconductor device (CSP) wherein connecting wiring is formed so as to extend from the surface of a semiconductor chip, on which an integrated circuit containing a photoreception region is formed, to a side face or the back face thereof in JP-A-2002-1 98463. With the semiconductor device (CSP), since the connecting wiring is formed so as to extend from the surface of the semiconductor chip to the side face or the back face thereof, the semiconductor device can be surface mounted on, for example, a mounting board, and so forth such that the surface of the semiconductor device, with a photoreception region (integrated circuit) formed thereon, faces outside so as to enable photoreception, thereby attaining ultra-compact mounting as a wafer level CSP.

Patent Document 1
 JP-A-2002-94035

Patent Document 2
 JP-2002-198463

However, it is to be pointed out that although the proposal described above has attained ultra-compact mounting, only an insulator layer is provided on the integrated circuit (photoreception region), although a form wherein a protection film is additionally formed on the integrated circuit is also disclosed, insufficiency in respect of durability still remains at present when taking into consideration the fact that the same is handled as one component as packaged.

SUMMARY OF THE INVENTION

The invention has therefore been developed to overcome various problems encountered in the past, and is intended to attain the following object. That is, the object of the invention is to provide a semiconductor device containing a photoreception region in its integrated circuit, having high durability while implementing ultra-compact mounting.

According to one aspect of the present invention, for achieving one or more of the above objects, there is provided a semiconductor device which includes a semiconductor device includes a semiconductor chip having a main surface provided with an integrated circuit including a photoelectric converter and a first wiring for electrically connecting the integrated circuit of the semiconductor chip to respective external terminals. The semiconductor device also includes a sealing resin for sealing the main surface of the semiconductor chip and the first wiring, formed so as to have an opening over the surface of the integrated circuit and a light-transmitting cap for covering the opening of the sealing resin.

BRIEF DESCRIPTION OF THE DRAWINGS

FIG. 1(A) is a plan view, and FIG. 1(B) is a sectional view;

FIG. 5(A) is a sectional view, and FIG. 5(B) is a plan view;

FIG. 6(A) is a sectional view, and FIG. 6(B) is a plan view;

FIG. 7(A) is a plan view, and FIG. 7(B) is a sectional view;

FIG. 8(A) is a plan view, and FIG. 8(B) is a sectional view;

FIG. 9(A) is a plan view, and FIG. 9(B) is a sectional view;

DETAILED DESCRIPTION OF PREFERRED EMBODIMENTS

Figure 1A:
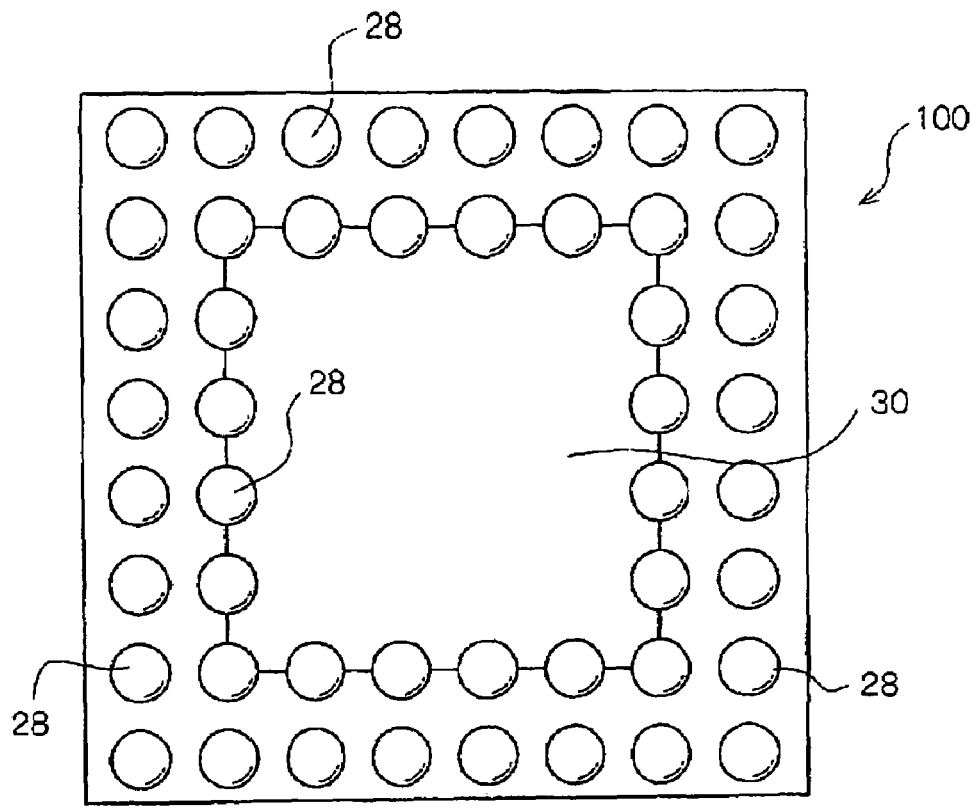
FIGS. 1(A) and 1(B) are schematic illustrations showing the configuration of a first embodiment of a semiconductor device according to the invention, where

Embodiments of a semiconductor device according to the invention are described hereinafter with reference to the accompanying drawings. Parts having the same functions in effect are denoted by like reference numerals throughout the figures, omitting description thereof in some cases.

Figure 1B:
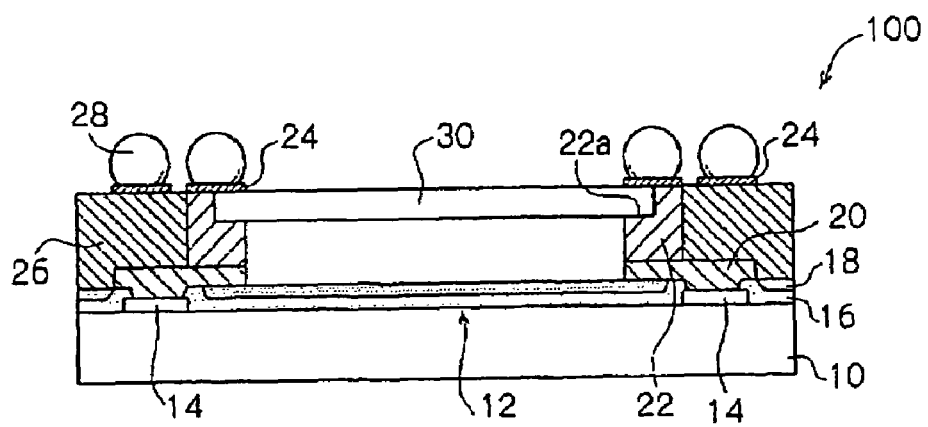

FIGS. 1(A) and 1(B) are schematic illustrations showing the configuration of a first embodiment of a semiconductor device according to the invention, where FIG. 1(A) is a plan view, and FIG. 1(B) is a sectional view. FIGS. 2(A) through 2(J) are schematic sectional views for illustrating a method of manufacturing the semiconductor device according to the first embodiment.

A semiconductor device 100 shown in FIGS. 1(A) and 1(B) has a semiconductor chip 10 on which surface there is formed an integrated circuit (referred to as a photoreception region in some cases hereinafter because the integrated circuit herein contains a photoelectric converter: a region denoted by reference numeral 12 in the figure) containing a photoelectric converter (solid state image sensor such as, for example, a CCD (charge-coupled device), CMOS (Complementary Metal-Oxide-Semiconductor) sensor, photodetector, etc.). Electrode pads 14 electrically continuous with the integrated circuit are formed on top of the semiconductor chip 10, and an insulator film (for example, a passivation film) 16 and a protection film (for example, a polyimide film) 18 are sequentially formed in part of the semiconductor chip 10, other than parts where the electrode pads 14 are provided.

Further, with the semiconductor device 100, there are formed a redistribution wiring layer 20 extended from the respective electrode pads 14, and bumps 22 for electrical connection with pads 24 for external connection, respectively, on the redistribution wiring layer 20. The bumps 22 are formed in the vicinity of the periphery of the integrated circuit, and are provided with a step 22a at respective tips thereof while the redistribution wiring layer 20 and the outer periphery of bumps 22, on the semiconductor chip 10, are sealed with a sealing resin 26 so as to have an opening over an integrated circuit surface. A light-transmitting cap 30 is engaged with the step 22a at the respective tips of the bumps 22, and is disposed in such a way as to cover the opening in the sealing resin 26.

The light transmitting cap 30 can be made of glass, transparent resin, or the like, but may be made of material having the function of an ultraviolet cut filter. Further, if focusing on the photoreception region is possible, the light transmitting cap 30 may function as a lens.

A solder ball 28 serving as a terminal for external connection is formed on top of the respective pads 24 formed so as to be electrically connected to the respective bumps 22.

Figure 3:
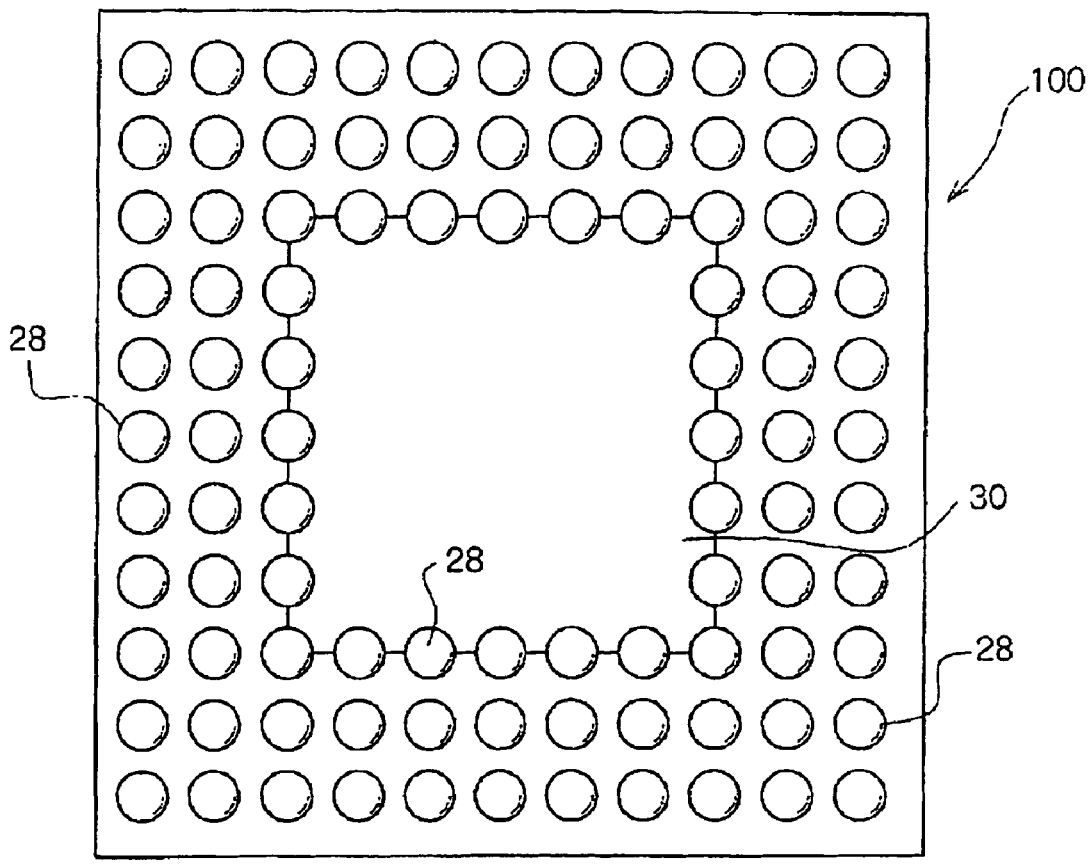
FIG. 3 is plan view showing another example of disposition positions of solder balls in the semiconductor device according to the first embodiment.

In the figure, the solder balls 28 are disposed so as to be arranged in two lines, but the invention is not limited thereto, so that the solder balls 28 may be disposed so as to be arranged in three lines as shown in FIG. 3.

Now, a process of manufacturing the semiconductor device 100 shown in FIGS. 1(A) and 1(B) is described hereinafter by way of example.

First, there is prepared a wafer 32, on which an integrated circuit of an element serving as a semiconductor chip 10 is formed, after evaluation of electrical characteristics thereof {FIG. 2 (A)}. The protection film 18 is applied to portions of the wafer 32, where the insulator film over the electrode pads 14 is removed, by the spin coater method, and so forth, and the protection film 18 is etched by subjecting the same to exposure using a mask for contact with the respective electrode pads 14 {FIG. 2(B)}. The redistribution wiring layer 20 as a base for forming wiring to be extended from the respective electrode pads 14 and forming the bumps 22 is formed by sputtering, plating, and so forth {FIG. 2 (C)}.

Subsequently, in order to form the bumps 22, a resist is applied over the wafer 32, and the resist is etched after subjecting the same to exposure using a mask, thereby forming openings in the resist. Thereafter, the bumps 22 are formed by plating, and so forth, and are cleaned after removing the resist {FIG. 2(D)}. At this point in time, there is formed the step 22a, to which the light-transmitting cap 30 is fitted, at the tip of each of the bumps 22, and as a method of forming the steps 22a, there are suitably performed, for example, a method of removing only a portion of the tip of each of the bumps 22 by edging and a method (for example, a two-stage plating method) of forming the bumps 22 in two stages, whereby the bumps 22 are formed to a predetermined height in a first stage and subsequently, an addition to the respective bumps 22, corresponding to only a portion of the respective tips thereof, is formed in the next stage.

Figure 2A:
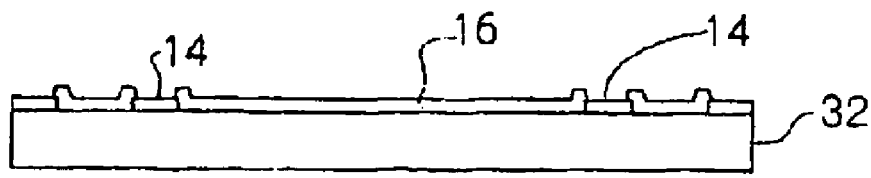
FIGS. 2(A) through 2(J) are schematic sectional views for illustrating a method of manufacturing the semiconductor device according to the first embodiment.
Figure 2B:
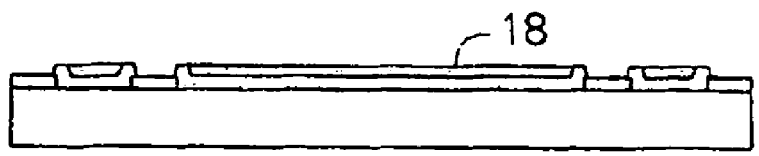
Figure 2C:
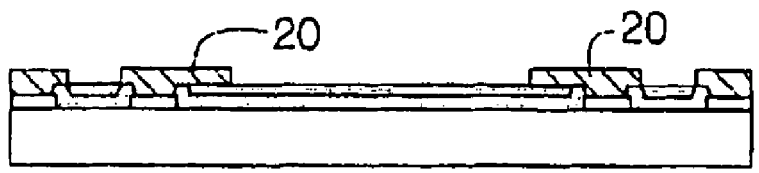
Figure 2D:
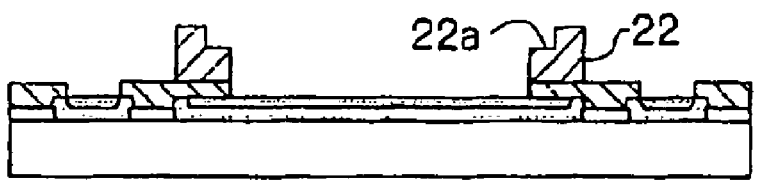
Figure 2E:
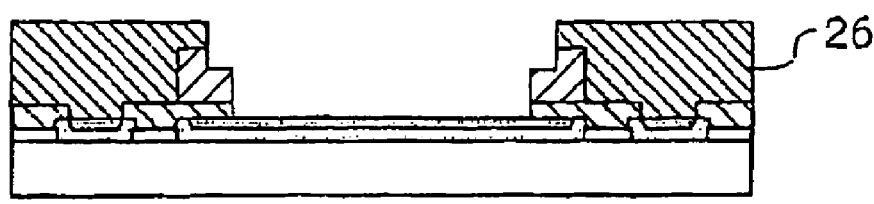
Figure 4:
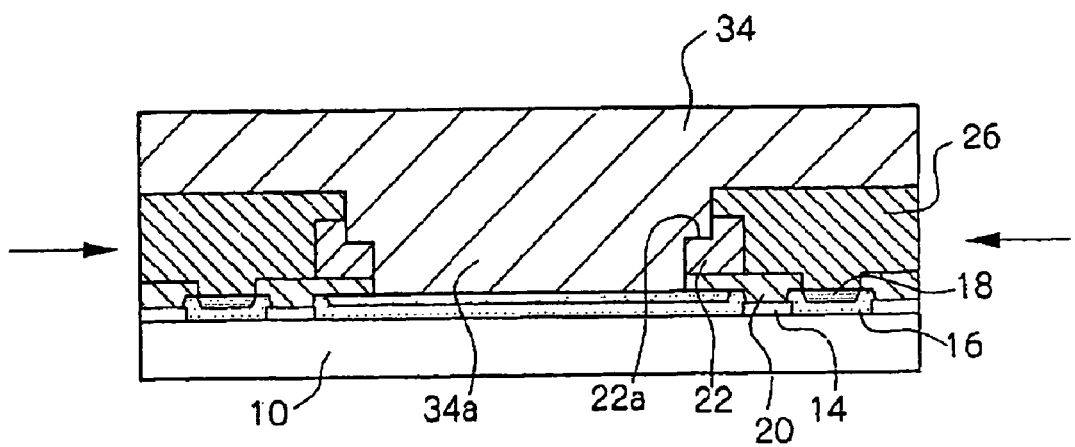
FIG. 4 is a sectional view showing an example of a method of sealing with a sealing resin in the semiconductor device according to the first embodiment.
Figure 5A:
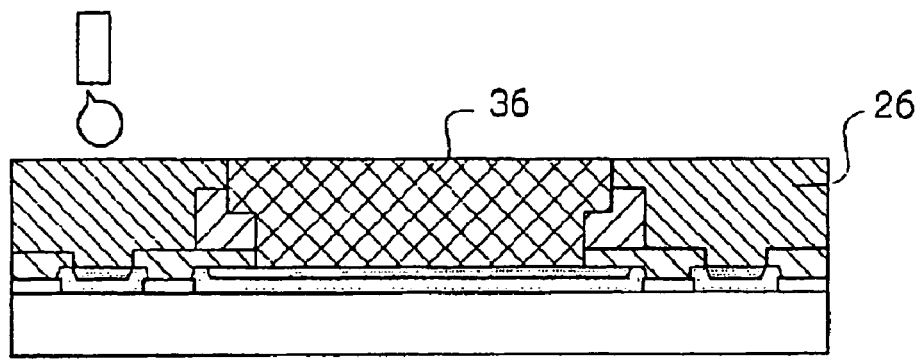
FIGS. 5(A) and 5(b) are sectional views showing another example of a method of sealing with a sealing resin in the semiconductor device according to the first embodiment, where
Figure 5B:
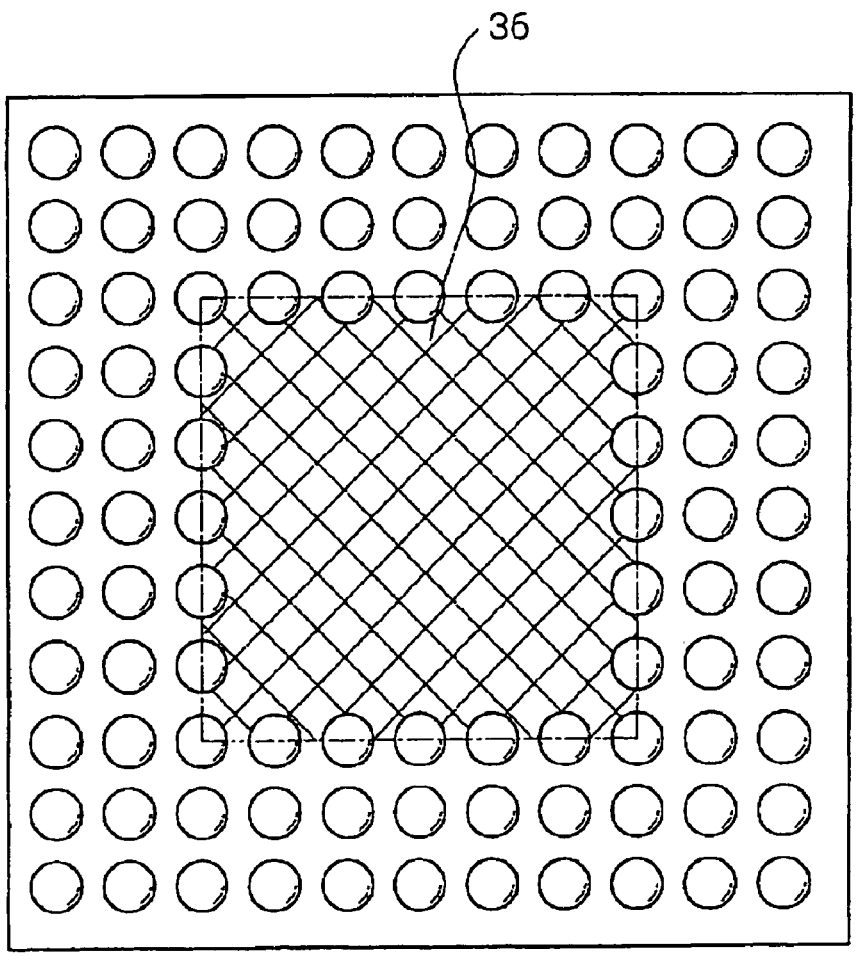
Figure 6A:
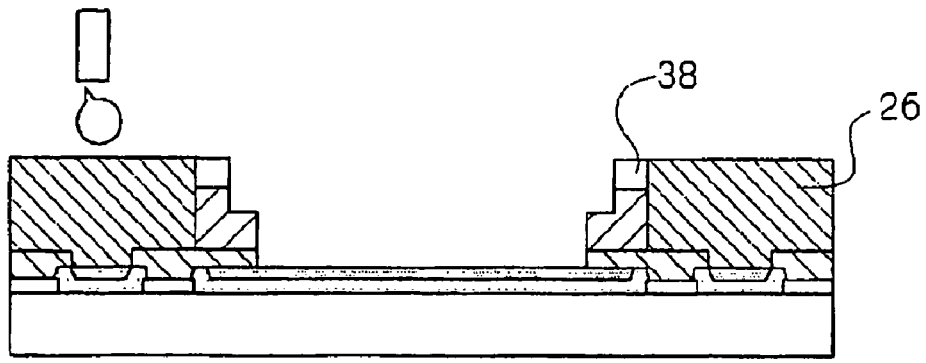
FIGS. 6(A) and 6(B) are sectional views showing still another example of a method of sealing with a sealing resin in the semiconductor device according to the first embodiment, where
Figure 6B:
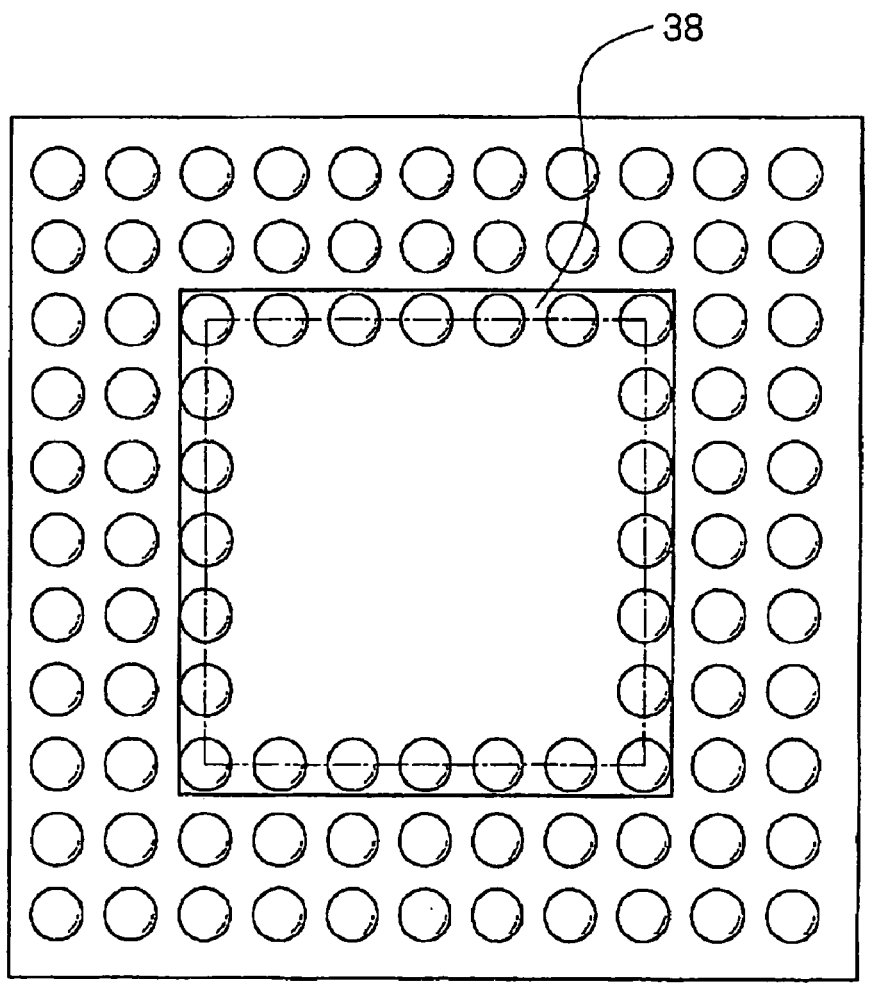

Next, the redistribution wiring layer 20 and the outer periphery of bumps 22 are sealed with the sealing resin 26 so as to define an opening over an integrated circuit surface {FIG. 2(E)}. In this case, as a method of sealing with the sealing resin 26 so as to define the opening over the integrated circuit surface, there is cited, for example, a method of employing a jig 34 covering the wafer 32 in whole and having a protruded part 34a on the surface thereof as shown FIG. 4. With this method, the jig 34 is placed such that the protruded part 34a is fitted into an integrated circuit forming region so as to be butted against the sidewall of the bumps 22 and the steps 22a as well as the integrated circuit surface, and the sealing resin 26 in liquid state is injected through a gap between the wafer 32 and the jig 34, that is, from horizontal sides of the wafer 32 (as indicated by the arrows in the figure) before sealing. Alternatively, there are suitably performed other methods such as a method of sealing by dropping the sealing resin 26 in liquid state from the top surface of the wafer 32 with the use of the jig 36 to be fitted into the integrated circuit forming region so as to be butted against the sidewall of the bumps 22 and the steps 22a as well as the integrated circuit surface, before sealing, as shown in FIG. 5, and a method of sealing by dropping the sealing resin 26 in liquid state from the top surface of the wafer 32 with the use of a frame 38 having protrusions for stopping up a gap between the bumps 22, adjacent to each other, of a plurality of the bumps 22 formed on the periphery of the integrated circuit, as shown in FIG. 6. Furthermore, there is also cited a method (not shown) of sealing by sealing the entire surface of the wafer 32 once with the sealing resin 26, and subsequently, by forming an opening in the integrated circuit forming region after etching by use of photolithographic techniques and so forth before sealing.

Figure 2F:
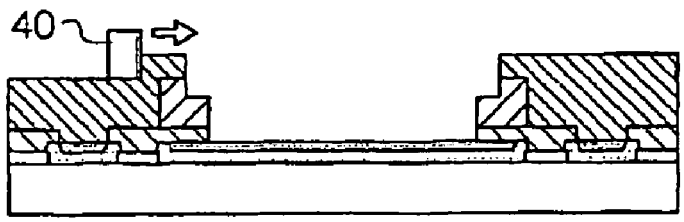

After sealing with the sealing resin 26, an upper portion thereof is cut by a grinder 40, and so forth (cutting tool, grindstone, buff, etc.) from the upper surface of the wafer 32, and the surface of the sealing resin 26 is ground (surface grinding), thereby exposing the bumps 22 hidden by the sealing resin 26 {FIG. 2(F)}.

Figure 2G:
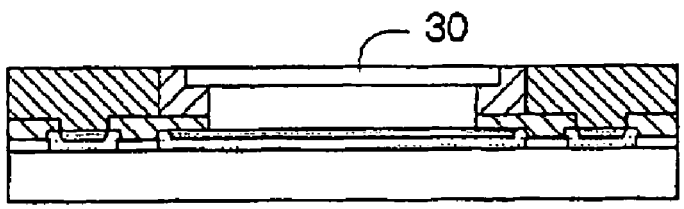

Subsequently, the light-transmitting cap 30 is fitted to the step 22a at the tip of each of the bumps 22, thereby covering the opening of the sealing resin 26 {FIG. 2(G)}.

Figure 2H:
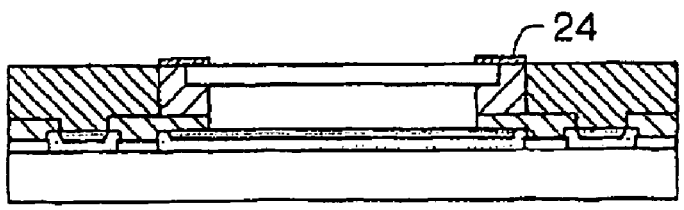
Figure 2I:
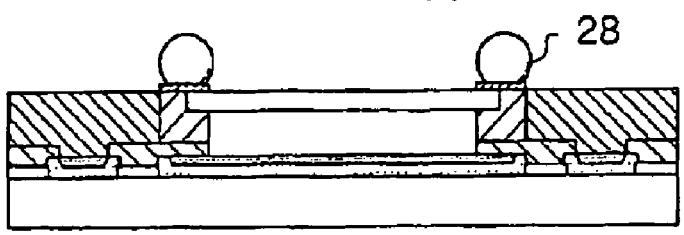
Figure 2J:
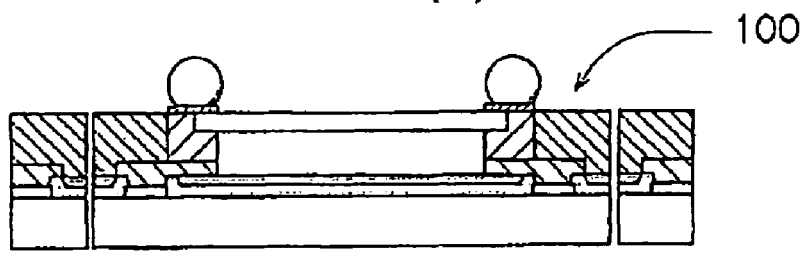

Thereafter, the pads 24 are formed on the respective tips of the bumps 22, and on parts of the periphery of the light-transmitting cap 30 by sputtering or plating {FIG. 2(H)}, further, the solder ball 28 is formed on top of the respective pads 24 {FIG. 2(I)}, and finally, the wafer 32 is scribed into individual pieces after testing, thereby obtaining the respective semiconductor devices 100 {FIG. 2(J)}.

The semiconductor device 100 according to the present embodiment is configured such that the redistribution wiring layer 20 and the bumps 22, on the periphery of integrated circuit, are sealed with the sealing resin 26, and the light-transmitting cap 30 is provided above (in the direction normal to the integrated circuit surface) the integrated circuit (photoreception region) so as to be packaged in a size substantially equivalent to that of the semiconductor chip 10. With the light-transmitting cap 30 being provided, light can shine on the photoreception region (integrated circuit) while the integrated circuit on the semiconductor chip 10 is shielded from outside. Hence, even with the semiconductor device containing the photoreception region in the integrated circuit, durability thereof can be enhanced while implementing ultra-compact mounting.

Further, with the present embodiment, since the light-transmitting cap 30 is disposed so as to be fitted to the step 22a at the respective tips of the bumps 22 formed in the vicinity of the periphery of the integrated circuit, misalignment in positioning of the light-transmitting cap 30 is not prone to occur by virtue of the steps 22a, so that the semiconductor device is insusceptible to the adverse effect of impact, and the like, and durability is thereby enhanced.

In addition, with the present embodiment, blanket processing in wafer state is possible in almost every step of a manufacturing method, that is, manufacturing making use of a wafer level CSP technology can be implemented, so that reduction in cost can be attained.

Second Embodiment

Figure 7A:
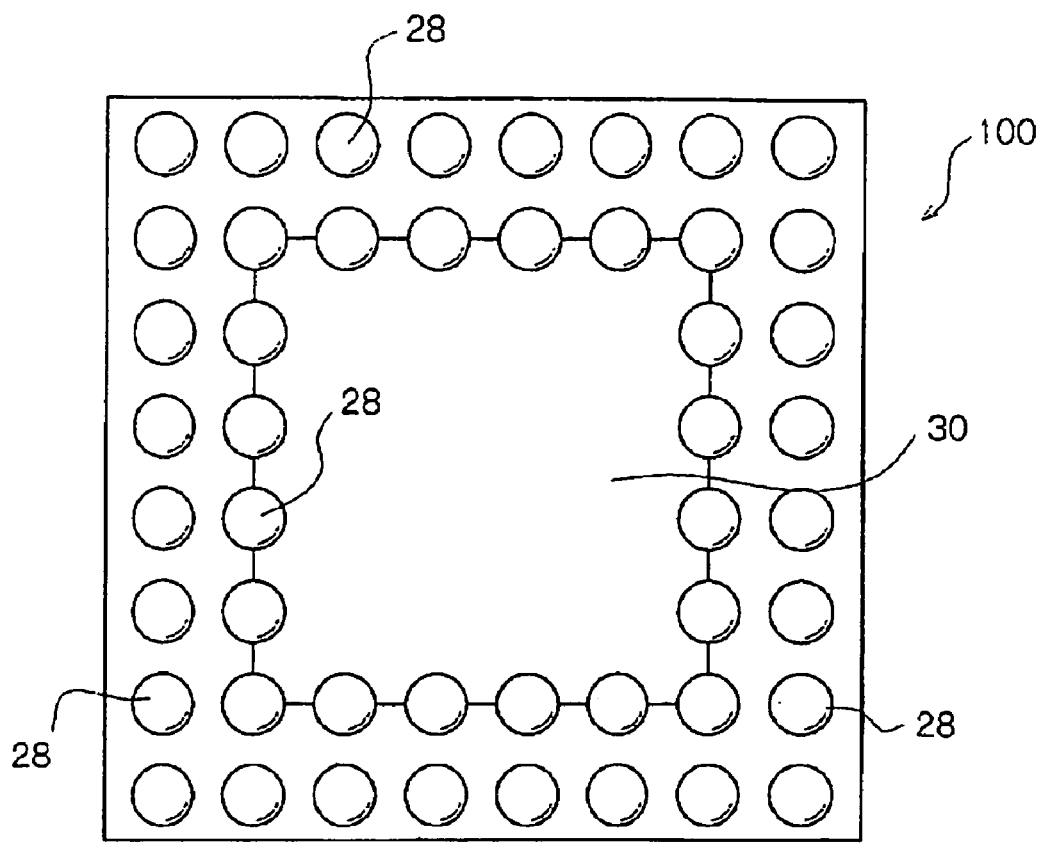
FIGS. 7(A) and 7(B) are schematic illustrations showing the configuration of a second embodiment of a semiconductor device according to the invention, where
Figure 7B:
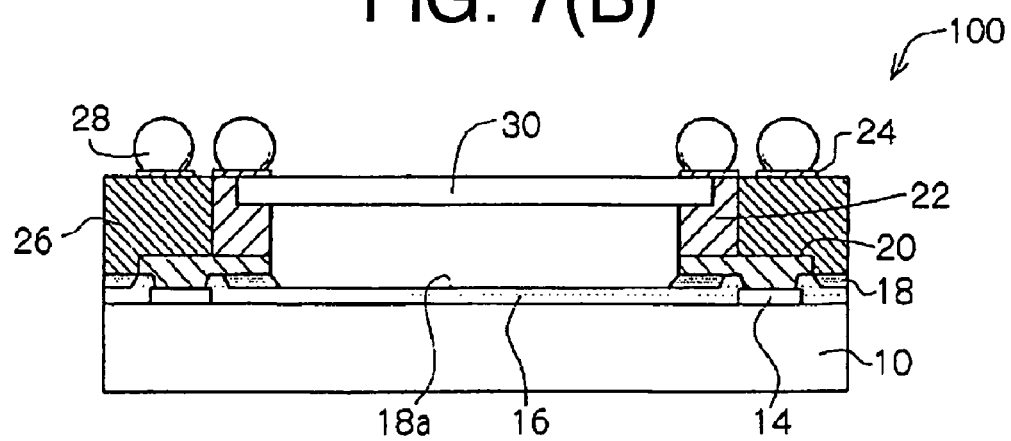

FIGS. 7(A) and 7(B) are schematic illustrations showing the configuration of a second embodiment of a semiconductor device according to the invention, where FIG. 7(A) is a plan view, and FIG. 7(B) is a sectional view.

The semiconductor device according to the second embodiment is the same in configuration as the semiconductor device according to the first embodiment except that a protection film 18 having an opening 18a over an integrated circuit (photoreception region) is provided. As a method of providing the protection film 18 with the opening 18a, there are available a method of selectively forming the protection film 18 by use of a mask at the time of forming the protection film 18 {refer to FIG. 2(B)} in the process of manufacturing the semiconductor device as described in the first embodiment, thereby defining the opening 18a, a method of forming the redistribution wiring layer 20 {refer to FIG. 2(C)}, and subsequently, defining the opening 18a by etching a portion of the redistribution wiring layer 20, in the integrated circuit forming region, by photolithographic techniques, and so forth.

When resin films having high dielectric constant (in the case of the first embodiment, the insulator film 16 and the protection film 18 exist) in the vicinity of a circuit, electric current normally has difficulty in flowing through the circuit. The reason for this is because the resin films (the dielectric constant of resin is normally about 4) having high dielectric constant block a magnetic field generated upon electric current flowing through the circuit, resulting in an increase in resistance of the circuit.

With the present embodiment, therefore, a portion of the protection film 18 among the resin films existing in the vicinity of integrated circuit, contributing to an increase in resistance, is removed, thereby causing the dielectric constant thereof to approach that of air, that is, 1, as much as possible, so that the semiconductor device can better cope with high speed RF.

Third Embodiment

Figure 8A:
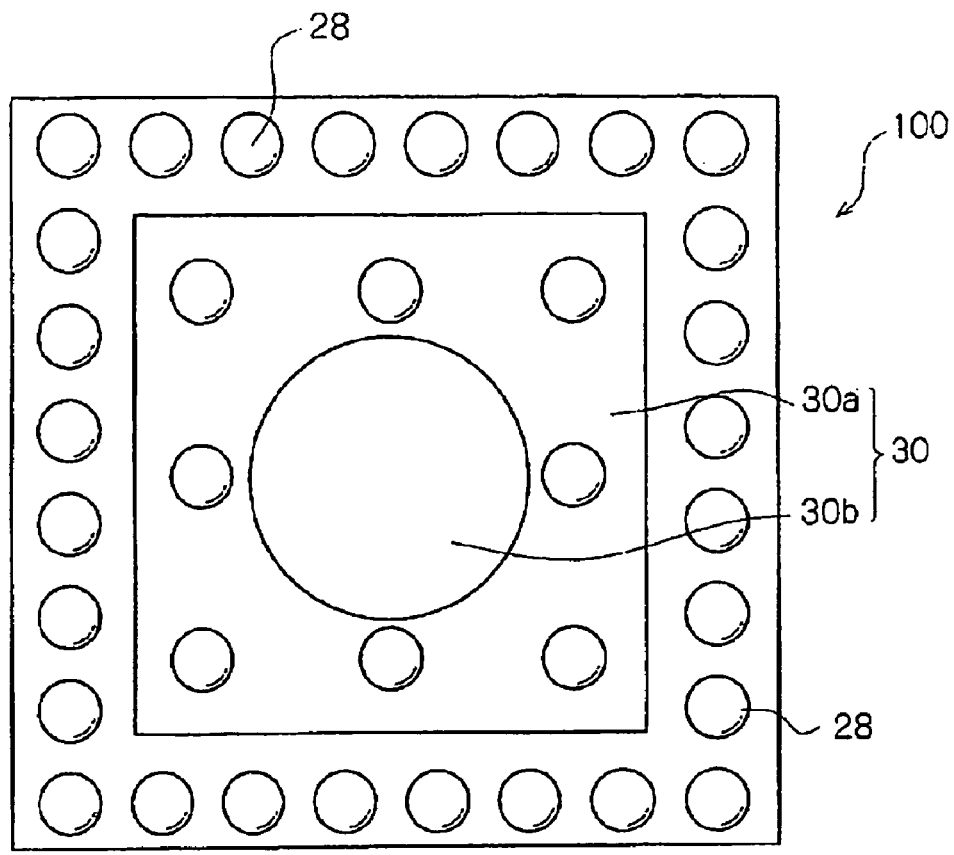
FIGS. 8(A) and 8(B) are schematic illustrations showing the configuration of a third embodiment of a semiconductor device according to the invention, where
Figure 8B:
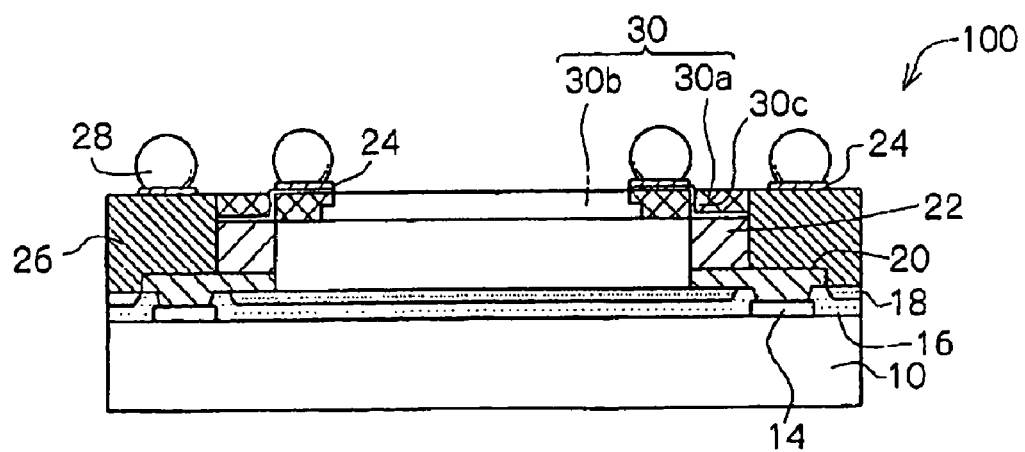

FIGS. 8(A) and 8(B) are schematic illustrations showing the configuration of a third embodiment of a semiconductor device according to the invention, where FIG. 8(A) is a plan view, and FIG. 8(B) is a sectional view.

With the semiconductor device according to the third embodiment, a light-transmitting cap 30 is made up of a portion of a wiring board 30a, and a cap 30b assembled into the central part of the wiring board 30a. Wiring 30c causing electrical continuity between the top surface and the back side by forming a through hole or the like for electrically connecting respective bumps 22 with respective pads 24 is provided on the periphery of the wiring board 30a. The wiring 30c is formed in the same wiring pattern as that for an ordinary printed wiring board. Further, the wiring board 30a may be of a multilayer wiring structure. The light-transmitting cap 30 can be made with ease by, for example, defining an opening at the central part of the wiring board 30a provided with any suitable wiring pattern, and provided with a protection film of a solder resist, and so forth, formed thereon, and by fitting the cap 30b into the opening.

The light-transmitting cap 30 (the wiring board 30a) is connected with the respective bumps 22 by, for example, forming terminals on the wiring board 30a by use of tin plating, and so forth, and by thermal compression bonding of each of the terminals with the respective bumps 22. Then, as with the case of the first embodiment, pads 24 are formed so as to be electrically connected with the wiring 30c of the wiring board 30a by sputtering, plating, and so forth.

With the present embodiment, since the light-transmitting cap 30 is made up such that a portion thereof is the wiring board 30a provided with a wiring pattern beforehand, there is an increase in flexibility in respect of disposition position (formation position) of the respective bumps 22 (solder balls 28).

Furthermore, with the present embodiment, since the light-transmitting cap 30 made up of the wiring board 30a provided with the wiring pattern beforehand is employed, blanket processing in wafer state is possible in almost every step of a manufacturing method, that is, manufacturing making use of the wafer level CSP technology can be implemented, so that reduction in cost can be attained.

In addition, with the present embodiment, if the wiring board 30a is provided with the bumps 22 beforehand, it is possible to omit a processing step of forming the bumps 22 as described in the first embodiment {FIG. 2 (H)}, so that further reduction in cost can be attained.

Fourth Embodiment

Figure 9A:
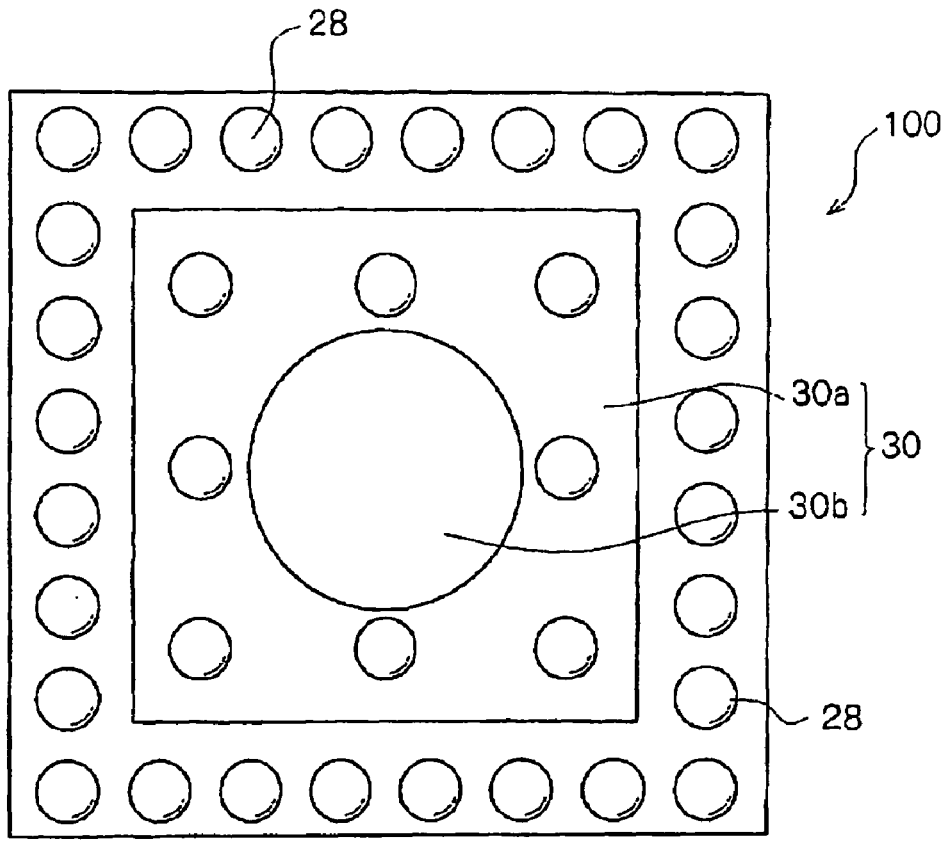
FIGS. 9(A) and 9(B) are schematic illustrations showing the configuration of a fourth embodiment of a semiconductor device according to the invention, where
Figure 9B:
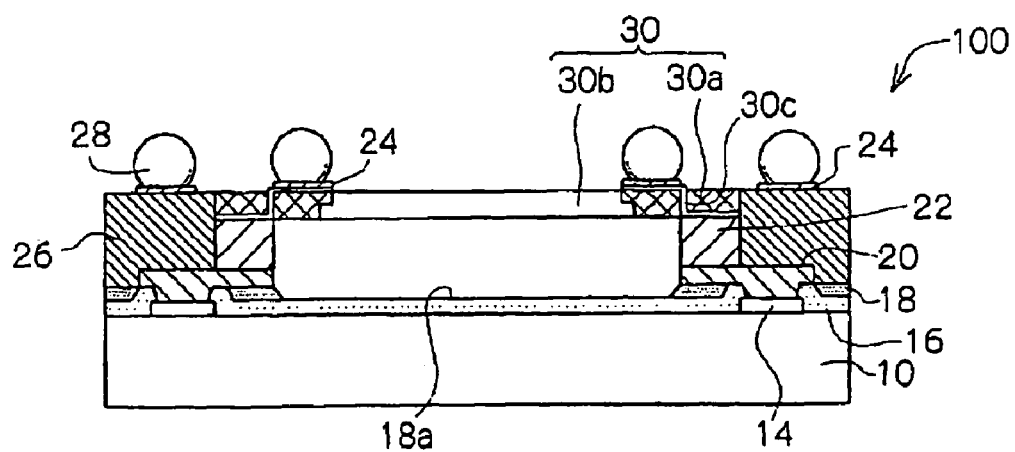

FIGS. 9(A) and 9(B) are schematic illustrations showing the configuration of a fourth embodiment of a semiconductor device according to the invention, where FIG. 9(A) is a plan view, and FIG. 9(B) is a sectional view.

The semiconductor device according to the fourth embodiment is the same in configuration as the semiconductor device according to the third embodiment except that a protection film 18 having an opening 18a over an integrated circuit (photoreception region) is provided.

With the present embodiment, a portion of the protection film 18 among the resin films existing in the vicinity of integrated circuit, contributing to an increase in resistance, is removed, thereby causing the dielectric constant to approach that of air, that is, 1, as much as possible, so that the semiconductor device can better cope with high speed RF as with the case of the second embodiment.

Fifth Embodiment

Figure 10:
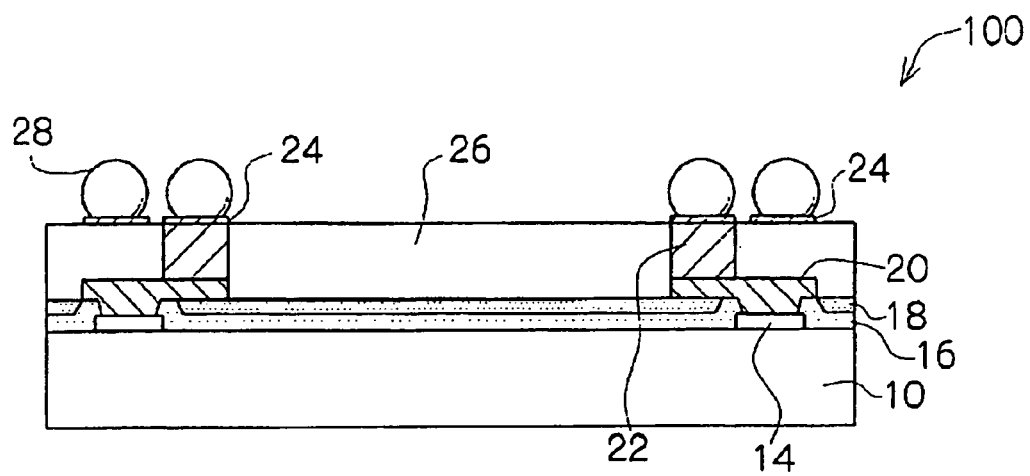
FIG. 10 is a sectional view showing the configuration of a fifth embodiment of a semiconductor device according to the invention.

FIG. 10 is a sectional view showing the configuration of a fifth embodiment of a semiconductor device according to the invention.

The present embodiment is configured such that a light-transmitting resin such as, for example, an epoxy resin etc. is used for a sealing resin 26, and the entire top surface of a semiconductor chip 10 is sealed with the sealing resin 26.

The semiconductor device according to the present embodiment is made up such that the entire top surface of the semiconductor chip 10 is sealed with the sealing resin 26 having a light-transmitting property, and the semiconductor device is packaged in a size substantially equivalent to that of the semiconductor chip 10. With the use of the sealing resin 26 having the light-transmitting property for sealing, light can shine on the photoreception region (integrated circuit) while shielding the integrated circuit on the semiconductor chip 10 from outside. Hence, even with the semiconductor device containing the photoreception region in the integrated circuit, durability thereof can be enhanced while implementing ultra-compact mounting.

Further, the semiconductor device according to the present embodiment adopts a configuration wherein sealing is implemented by the sealing resin 26 having the light-transmitting property, so that the thickness of films can be further reduced in comparison with the case of the first embodiment.

In addition, with the present embodiment, processing steps of forming the step 22a for each of the bumps 22, and fitting the light-transmitting cap 30 into the opening can be omitted, so that further reduction in cost can be attained in comparison with the case of the first embodiment.

Sixth Embodiment

Figure 11:
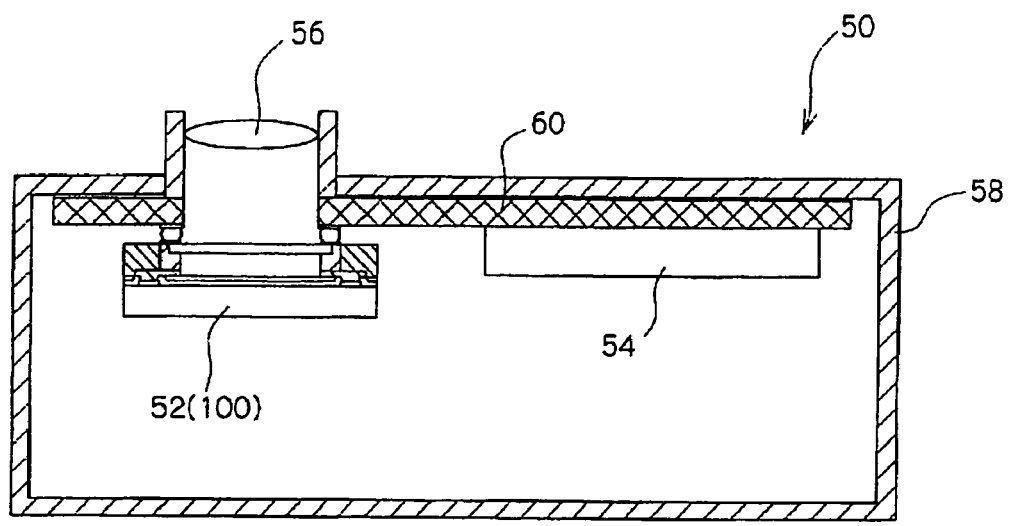
FIG. 11 is a schematic illustration showing the configuration of a camera module according to a sixth embodiment of the invention.

FIG. 11 is a schematic illustration showing the configuration of a camera module according to a sixth embodiment of the invention.

Figure 12:
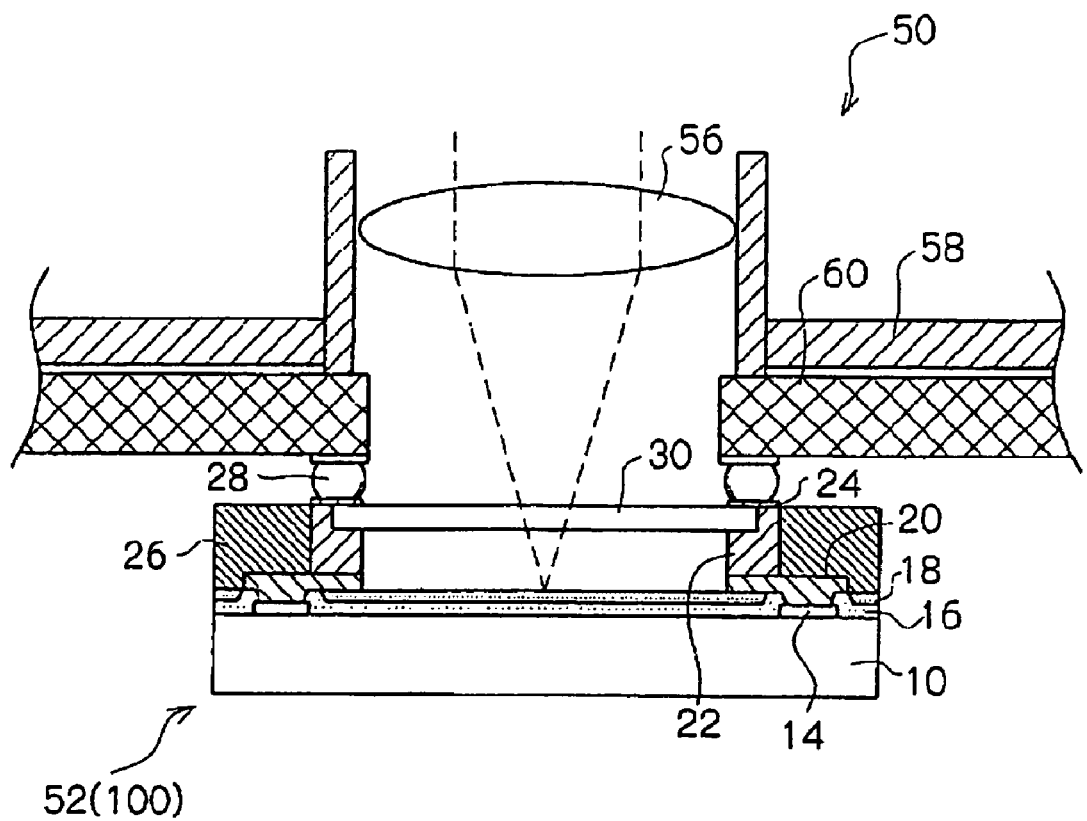
FIG. 12 is an enlarged schematic view for illustrating the disposition position of a sensor in the camera module according to the sixth embodiment of the invention.
Figure 13:
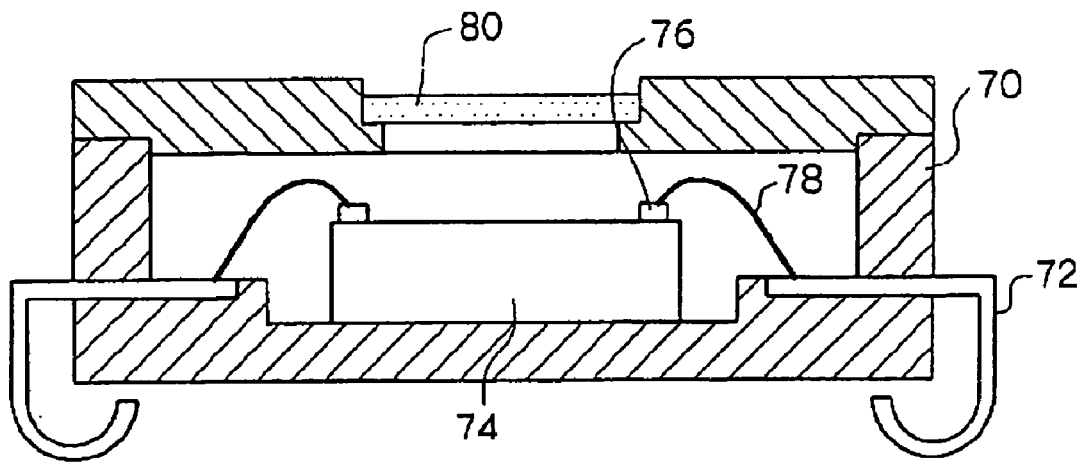
FIG. 13 is a schematic illustration showing the configuration of a conventional semiconductor device package.

A camera module (optical apparatus) 50 comprises a lens 56, a sensor 52 disposed in a rearward position along the optical axis, a DSP (Digital Signal Processor) 54 for executing predetermined digital signal processing against digital signals as inputted, and a case 58. The sensor 52 and the DSP 54 are mounted on a mounting board 60, and as shown in FIG. 12, the sensor 52 is mounted such that a photoreception region (integrated circuit) thereof is opposed to the side of the mounting board 60 so as to receive light rays through an opening 60a provided in the mounting board 60. Further, although not shown in the figure, the sensor 52 is connected to the DSP 54 through the intermediary of an analog/digital converter for converting analog signals as inputted into digital signals. In the figures, other constituent members and wiring are omitted for the sake of brevity.

With the present embodiment, the semiconductor device 100 according to any of the first through fifth embodiments is applied thereto as the sensor 52 of the camera module of such a configuration as described. Hence, ultra-compact mounting of the sensor 52 can be implemented, so that it becomes possible to attain down-sizing of the camera module, and to enhance durability thereof.

Thus, the camera module according to the present embodiment is suitably applicable to an electronic equipment making advances in miniaturization, such as mobile phone, handy camera, and so forth.

Now, it is to be understood that any of the preferred embodiments of the invention, described above, should not be construed as limiting the scope of the invention, and obviously, various changes and modifications may be made without departing from the spirit and scope of the invention.

As described in the foregoing, with the semiconductor device according to the invention, containing the photoreception region in the integrated circuit thereof, high durability can be ensured while implementing ultra-compact mounting.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device comprising:
   a semiconductor chip having a main surface provided with an integrated circuit including a photoelectric converter;
   a plurality of electrodes formed in a vicinity of a periphery of the integrated circuit;
   a sealing resin for sealing the main surface of the semiconductor chip and at least a first side surface of each of the electrodes, the sealing resin formed so as to have an opening over a surface of the integrated circuit; and
   a light-transmitting cap disposed so as to cover the opening of the sealing resin,
   wherein the electrodes are electrically connected to the integrated circuit and to respective external terminals,
   wherein each of the electrodes has a columnar shape and is provided with a step at a top surface thereof, and
   wherein the light-transmitting cap is engaged with the step of each of the electrodes.

2. A semiconductor device comprising:
   a semiconductor chip having a main surface provided with an integrated circuit including a photoelectric converter;
   a plurality of electrodes formed in a vicinity of a periphery of the integrated circuit;
   a sealing resin for sealing the main surface of the semiconductor chip and at least a first side surface of each of the electrodes, the sealing resin formed so as to have an opening over a surface of the integrated circuit; and
   a light-transmitting cap disposed so as to cover the opening of the sealing resin,
   wherein the light-transmitting cap is provided with a wiring for connecting the electrodes to respective external terminals.

3. A semiconductor device comprising:
a semiconductor chip having a main surface provided with an integrated circuit including a photoelectric converter;
a plurality of electrodes formed in a vicinity of a periphery of the integrated circuit;
a sealing resin for sealing the main surface of the semiconductor chip and at least a first side surface of each of the electrodes, the sealing resin formed so as to have an opening over a surface of the integrated circuit; and
a light-transmitting cap disposed so as to cover the opening of the sealing resin,
wherein a protection film having an opening is provided over the main surface of the semiconductor chip and wherein the opening is positioned over the main surface of the semiconductor chip.

4. A semiconductor device comprising:
a semiconductor chip which has a main surface provided with an integrated circuit including a photoelectric converter;
a plurality of electrode pads formed on the main surface;
a plurality of first wiring patterns, each of which extends over the main surface and each of which has a first end connected to a corresponding one of the electrode pads;
a plurality of bump electrodes, each of which has a bottom surface contacting with a second end of a corresponding one of the first wiring patterns;
a sealing resin which seals surfaces of the first wiring patterns and sides of the bump electrodes, wherein the electrode pads, the first wiring patterns, the bump electrodes and the sealing resin are positioned at a periphery of the semiconductor chip;
a plurality of external terminals, each of which is formed on a top surface of a corresponding one of the bump electrodes; and
a light-transmitting cap provided on the top surfaces of the bump electrodes so as to cover a center of the semiconductor chip.

5. A semiconductor device according to claim 4,
wherein at least some of the bump electrodes have a step at the top surface thereof, and
wherein the light-transmitting cap is engaged with the steps.

6. A semiconductor device according to claim 4, further comprising second wiring patterns which connect the bump electrodes to respective ones of the external terminals, wherein the second wiring patterns are formed on the light-transmitting cap.

7. A semiconductor device according to claim 4, further comprising a protection film having an opening which is provided over the main surface of the semiconductor chip, wherein the opening is positioned over the main surface of the semiconductor chip.

8. A semiconductor device according to claim 4, wherein the bump electrodes are arranged in a matrix form.

9. A semiconductor device comprising:
a semiconductor chip which has a main surface provided with an integrated circuit including a photoelectric converter;
a plurality of electrode pads formed on the main surface;
a plurality of redistribution wiring patterns, each of which extends over the main surface and each of which has a first end connected to a corresponding one of the electrode pads;
a plurality of bump electrodes, each of which has a bottom surface contacting with a second end of a corresponding one of the redistribution wiring patterns;
a sealing resin which seals surfaces of the redistribution wiring patter and sides of the bump electrodes, wherein the electrode pads, the redistribution wiring patterns, the bump electrodes and the sealing resin are positioned at a periphery of the semiconductor chip;
a plurality of external terminals, each of which is formed on a top surface of a corresponding one of the bump electrodes; and
a light-transmitting cap provided on the top surfaces of the bump electrodes so as to cover a center of the semiconductor chip.

10. A semiconductor device according to claim 9,
wherein at least some of the bump electrodes have a step at the top surface thereof, and
wherein the light-transmitting cap is engaged with the steps.

11. A semiconductor device according to claim 9, further comprising wiring patterns which connect the bump electrodes to respective external terminals, wherein the wiring patterns are formed on the light-transmitting cap.

12. A semiconductor device according to claim 9, further comprising a protection film having an opening which is provided over the main surface of the semiconductor chip, wherein the opening is positioned over the main surface of the semiconductor chip.

13. A semiconductor device according to claim 9, wherein the bump electrodes are arranged in a matrix form.

* * * * *